United States Patent [19]

Rusch et al.

[11] 3,937,958
[45] Feb. 10, 1976

[54] CHARGED PARTICLE BEAM APPARATUS

[75] Inventors: Thomas W. Rusch, Falcon Heights; Jerry A. Sievers, Stillwater, both of Minn.

[73] Assignee: Minnesota Mining and Manufacturing Company, St. Paul, Minn.

[22] Filed: Mar. 31, 1975

[21] Appl. No.: 563,330

[52] U.S. Cl. ............................ 250/307; 250/396 R
[51] Int. Cl.² ........................................ H01J 37/26
[58] Field of Search ........... 250/396, 397, 398, 399, 250/307, 309, 310, 311

[56] References Cited
UNITED STATES PATENTS

| | | | |
|---|---|---|---|
| 2,422,807 | 6/1947 | Smith | 250/396 |
| 3,840,743 | 10/1974 | Tamura et al. | 250/307 |

*Primary Examiner*—Archie R. Borchelt
*Assistant Examiner*—T. N. Grigsby
*Attorney, Agent, or Firm*—Alexander, Sell, Steldt & DeLaHunt

[57] ABSTRACT

A charged particle beam (e.g., ions or electrons) apparatus including two electrostatic focusing lenses and an electrode having a diameter limiting aperture positioned between the lenses is further provided with two electrode assemblies which interact with an extractor electrode and with a source of charged particles such that the trajectories of the particles in the beam passing through the second of the two assemblies are substantially parallel. This feature and other disclosed improvements facilitate the production of a substantially monoenergetic beam which under a first set of conditions can be focused to provide a small-diameter, spherical-aberration limited beam and which under another set of conditions, can be focused to provide a high current beam.

31 Claims, 1 Drawing Figure

U.S. Patent    Feb. 10, 1976    3,937,958
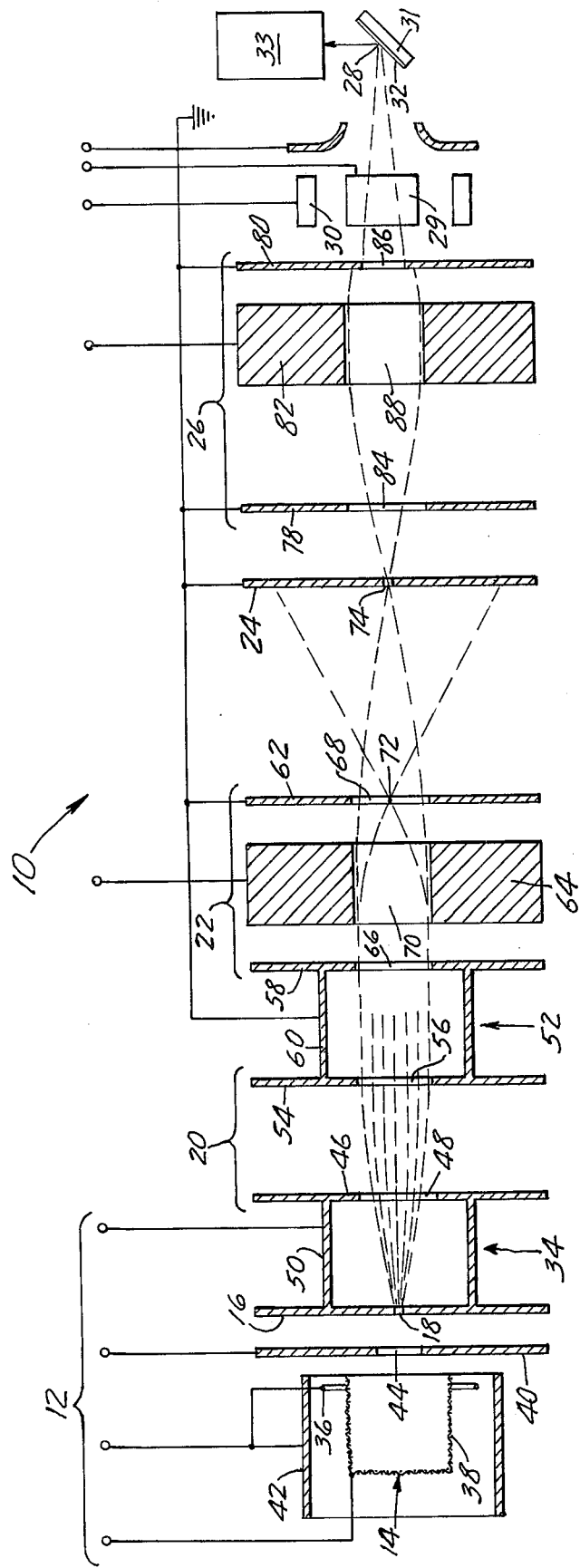

CHARGED PARTICLE BEAM APPARATUS

BACKGROUND OF THE INVENTION

1. Field of the Invention

This invention relates to apparatus for generating charged particle beams, e.g., electron and ion guns. Such beams are typically utilized to bombard surfaces to cause the emission of particles therefrom, which particles may then be analyzed to determine the composition or other characteristics of the surface.

2. Background of the Prior Art

One type of apparatus for generating a charged particle beam, especially for generating a highly focused beam of positive ions, ionizes gas atoms in an electrical discharge and extracts the ions thus formed by suitable electric and/or magnetic fields to form the beam. Such plasmatron sources are capable of providing intense beams; however, the high energies involved in the plasma result in an ion beam containing ions in a number of different ionization states, which have a considerable spread in energy and which contains ions of a variety of elements. Filtering of such a beam is often required if the beam is to be used in applications where a monoenergetic beam is required.

Another general type of ion gun for directly producing a beam having a considerably smaller spread in energies utilizes low voltage electron bombardment of gas atoms such that substantially all of the energy of the ions in the ultimately produced beam is provided upon acceleration. One such gun is disclosed in U.S. Pat. No. 3,665,182 (Goff & Smith). While such a device is capable of providing a substantially monoenergetic beam, it is incapable of providing a highly focused beam. If apertured to a small diameter, the current would be reduced to an undesirable extent for such purposes as forming an image representing surface characteristics.

U.S. Pat. No. 3,840,743 (Tamura & Kondo) discloses an ion gun including two focusing lenses and a plate having a relatively large diameter aperture positioned therebetween. A plasmatron type ion source having a small source diameter is disclosed. The spot diameter of the beam is said to be variable to any desired value from 1 micrometer to several hundred micrometers. Such a variation is readily produced by changing the potential in the first focusing lens such that a variable amount of the beam is blocked by the aperture plate. However, as discussed hereinabove, the energy spread and varying composition of such a beam precludes its use in many applications.

THE INVENTION

In contrast to such prior art charged particle apparatus, the apparatus of the present invention permits a substantially monoenergetic beam to be generated which, under a first set of conditions, can be focused to a very small diameter spot, the diameter of which is essentially limited by spherical aberration, and which under another set of conditions can be focused to provide a high current beam. In the novel apparatus, the charged particles emanating from the source are accelerated and directed into substantially parallel trajectories. Such a condition facilitates the construction of a highly compact and relatively simple structure which is, nonetheless, capable of producing the aforementioned small diameter beam without requiring the application of uneconomically large electrical potentials.

The novel apparatus comprises means for generating a charged particle beam including therein a source of charged particles and a primary extractor electrode having an aperture defining the effective diameter of the generated beam. Preferably, the source includes a source of electrons which may be directed to form an electron beam or which may be directed to bombard gas atoms to form a positive ion beam. Sequentially downstream from the source are means for accelerating the charged particles in the beam, a first means for focusing the beam at a cross-over point, an electrode having an aperture for limiting the diameter of the focused beam, and a second means for focusing the beam at a target. As used herein, upstream or downstream means the relative direction from the source of charged particles to the target.

A primary improvement of the present invention over the prior apparatus lies in the accelerating section, wherein first and second electrode assemblies are provided. The first electrode assembly comprises the primary extractor electrode at the upstream end together with means for providing a unipotential-surface, circularly-symmetric about the axis, extending a first predetermined distance downstream from the primary extractor electrode. The second electrode assembly is positioned to have its upstream end spaced downstream from the downstream end of the first assembly a second predetermined distance, and includes means for providing a circularly-symmetric, axially-centered, unipotential surface extending axially a third predetermined distance. Preferably, these three predetermined distances are equal.

The apparatus further includes means for applying a given potential between the source of charged particles and the second electrode assembly and means for applying a given fraction of that potential to the first electrode assembly. These potentials and the respective assemblies establish an electrostatic lens, and are selected to cause a focal point of the electrostatic lens to be approximately in the plane of the aperture of the primary extractor electrode such that the trajectories of charged particles passing through the second electrode are substantially parallel.

It has been found that such a parallel beam may be focused to provide a small diameter beam and enhanced current density at the target under a given set of focusing conditions. Because of such parallelity, the beam may be focused under a first set of focusing conditions at a cross-over point within the first focusing lens, thus enabling the apparatus to be relatively short and compact.

BRIEF DESCRIPTION OF THE DRAWING

The drawing is a cross section of a preferred embodiment of the apparatus of the present invention.

DESCRIPTION OF THE PREFERRED EMBODIMENT

The embodiment of the present invention shown in the drawing is intended to be exemplary only. It is within the scope of the present invention that a number of constructional variations such as other types of charge particle generators and focusing elements may be substituted for those shown in this embodiment.

The illustrated apparatus may employ any type of charged particles but will hereinafter be described primarily in connection with a positive ion beam.

As shown in the drawing, the apparatus 10 comprises an ion generator 12 which includes a source of charged particles shown generally as 14 and a primary extractor electrode 16 having an aperture 18. The aperture 18 controls the passage of ions from the source and thus defines the effective diameter of the generated beam. The effective source diameter is believed to be approximately one-half the diameter of the aperture 18. Sequentially positioned downstream of the generator 12 is an acceleration section shown generally as 20, a first focusing lens 22, a diameter limiting electrode 24 and a second focusing lens 26. Upon emerging through the second lens 26 the beam is focused at a target 28. The apparatus preferably includes deflection electrodes 29 and 30 positioned between the second focusing lens 26 and the target 28. A sample 31 a surface 32 of which is to be analyzed may be positioned at the target 28. Suitable equipment 33 for receiving particles emitted from the surface and for analyzing those emissions may also be provided. Such particles may include scattered and sputtered ions, secondary electrons, photons and the like.

The ion generator 12 comprises a source of electrons 36, an electron permeable cylindrical grid 38 and a supplemental extractor electrode 40. The electron source 36 is a circular single-turn filament which encircles the cylindrical grid 38 and which lies in a plane approximately normal to the axis of the beam. The single-turn filament 36 is positioned near the supplemental extractor electrode 40, i.e., upstream therefrom a distance not greater than the diameter of the aperture 44. Such positioning is desirable in that electrons emitted from the filament are attracted through the grid near the extraction electrodes. Ionization of gas atoms is thus concentrated proximate the extraction electrodes to increase the probability with which the created ions are attracted into the resultant beam. Such a filament 36 is conveniently formed of a single turn of 0.005 inch diameter tungsten wire, approximately 0.75 (1.9 cm) inch in diameter, and may be energized with 7 volts to produce a 15 milliamp current of electrons. The cylindrical grid 38 is an open mesh tungsten screen having 90% open area and is approximately ½ (1.27 cm) inch in diameter and ½ (1.27 cm) inch long and is closed on the upstream end thereof with a similar open mesh screen or solid tantalum plate. The ion generator 12 further includes a stainless steel outer reflecting cylinder 42 which may be electrically coupled to the filament 36 or biased negatively thereto so as to reflect electrons emitted from the filament and increase the flow of electrons through the grid 38.

The supplemental extractor electrode 40 is a stainless steel plate having a circular aperture 44 concentric with the aperture 18, the cylindrical grid 38 and the filament 36. The electrode 40 is positioned downstream from the lower end of the grid 38 a distance approximately 0.10 (0.25 cm) inch. The diameter of the aperture 44 is approximately 0.25 (0.63 cm) inch.

The first electrode assembly 34 includes the primary extractor electrode 16 at the upper end of the assembly and integral therewith. The electrode 16 is planar, and its aperture 18 is preferably within the range of 0.015 to 0.05 inch (0.038 to 1.27 cm) and is 0.040 inch (0.1 cm) in diameter. The first electrode assembly 34 further comprises a first acceleration electrode 46 which is planar and includes a circular aperture 48, which is large relative to the aperture 18 but which is not greater in diameter than the distance between the primary extractor electrode 16 and the first acceleration electrode 46, i.e., the first predetermined distance. The aperture 48 is 0.375 inch (0.95 cm) in diameter. Extending between and integral with the first acceleration electrode 46 and the primary extractor electrode 16 is a cylindrical section which is equal to or larger in diameter than the aperture 48, and is 0.75 inch (1.9 cm). This cylindrical member 50 spaces the first acceleration electrode 46 from the primary extractor electrode 16 the first predetermined distance and provides a circularly-symmetric axially-centered unipotential surface extending over that distance. In the emodiment shown in the drawing, this distance is shown approximately as 0.55 inch (1.4 cm). The restricted diameter of the aperture 48 lessens the effect of fields emanating from downstream electrodes upon fields within the first electrode assembly 34.

The second electrode assembly 52 includes a second acceleration electrode 54 at the upstream end thereof. The electrode 54 is planar and includes a circular aperture 56 therein, which aperture is large relative to the aperture 18 and is 0.375 inch (0.95 cm) in diameter. Positioned at the downstream end of the second electrode assembly 52 is another planar electrode 58 which forms the upstream outer electrode of the first focusing lens 22, and which defines the downstream limit of the unipotential surface associated with this assembly. Extending between the electrodes 54 and 58 and integral therewith is a circular section 60 which separates the two electrodes 54 and 58 a third predetermined distance. The second electrode assembly 52 is positioned such that the second acceleration electrode 54 is spaced downstream from the first acceleration electrode 46 a second predetermined distance. Preferably, the first, second and third predetermined distances are equal, and are 0.55 inch (1.4 cm). The diameter of aperture 56 is large with respect to the aperture 18 but is not greater than the third predetermined distance, so as to lessen the effect of fields emanating from the first electrode assembly 34 on fields within the second electrode assembly 52. The diameter of the aperture 56 is 0.375 inch (0.95 cm).

The first focusing lens 22 is a symmetric einzel lens having an upstream outer electrode 58, a downstream outer electrode 62 and an axially thick center electrode 64, each having an axially located aperture 66, 68 and 70 respectively, which apertures are substantially equal in diameter. The third predetermined distance is greater than the diameters of the apertures 66, 68 and 70 so as to minimize the interacting fields. Furthermore, the spacing between the upstream and downstream outer electrodes 58 and 62 and the center electrode 64 is preferably approximately equal to the radius of the aperture 70. The axial length of the center electrode 64 is not less than the radius of the aperture 70, and is preferably approximately equal to the diameter thereof. This ensures that when a potential less than that applied to the acceleration section 20 is applied between the outer electrodes 58 and 62 and the center electrode 64, such a potential will be sufficient to cause the cross-over point 72 at which the beam is focused to lie in the plane of the downstream electrode 62.

The downstream diameter limiting electrode 24 is preferably planar and has an aperture 74 axially centered therein. The radius of the aperture 74 and the spacing of the electrode 24 from the downstream electrode 62 are selected such that the ratio between the radius and the spacing is not greater than 0.1. The diameter of the aperture 74 ranges between 0.03 and 0.08 inch (0.076 and 0.20 cm). The spacing between the electrode 24 and the downstream electrode 62 is approximately 1.27 inches (3.22 cm). In one embodiment, the diameter of the aperture 74 is substantially equal to the diameter of the aperture 18 in the primary extractor electrode 16.

Downstream of the diameter limiting electrode 24, is positioned the second focusing lens 26. This lens comprises an asymmetric einzel lens including a relatively thin upstream outer electrode 78, a relatively thin downstream outer electrode 80 and an axially thick center electrode 82, all of which have axially located apertures 84, 86 and 88 respectively. The diameter of the apertures 84 and 88 are approximately equal and are 0.375 inch (0.95 cm), while the diameter of the aperture 86 in the downstream outer electrode 80 is somewhat smaller, and is 0.20 inch (0.51 cm), thereby shielding electrostatic fields within the second lens 26 from external fields downstream thereof. The second focusing lens 26 is positioned downstream of the diameter limiting electrode 24 a distance such that the separation between the electrode 24 and the outer upstream electrode 78 is approximately equal to the diameter of the aperture 84, and is 0.375 inch (0.95 cm). The axial length of the center electrode 82 is preferably not less than the radius of the aperture 88 therethrough. The downstream outer electrode 80 is positioned to permit the beam to be focused by a potential less than the potential applied to the acceleration section 20 on a target 28 beyond the downstream outer electrode 80, a distance sufficient to facilitate the intermediate placement of the deflection plates 29 and 30. The spacing between the upstream outer electrode 78 and the center electrode 82 is preferably greater than one-half but less than three times the diameter of the apertures 84 and 88, thereby minimizing spherical aberration such as may be accentuated by the asymmetric placement of the downstream electrode 80.

The relative spacing of the diameter limiting electrode 24 and the diameter of the radius therein are selected such that the ratio between the radius of the aperture 74 and the spacing between the electrode 24 and the downstream electrode 62 of the first focusing lens 22 is maximized consistent with a desired minimum beam radius at the target 28 according to the following expression:

$$\frac{r_A}{L} = \tan\left\{\frac{4r_t}{M_{L2}C_{S2}}\right\}^{1/3}, \text{ where}$$

$r_A$ is the radius of the aperture in the diameter limiting electrode,
L is the distance between the diameter limiting electrode and the downstream outer electrode of the first einzel lens,
$r_t$ is the beam radius at the target, ignoring components due to a finite source size,
$M_{L2}$ is the magnification factor of the second einzel lens, and
$C_{S2}$ is the spherical aberration coefficient of the second lens.

Since a change in the physical size or placement of any one of the structural elements or a change in the applied potential on the elements affects the resultant beam diameter and current, such changes are preferably made in an iterative manner, i.e., making repeated adjustments in the position and size of the various apertures and in the potentials applied to the various electrodes to determine the optimum conditions consistent with a desired beam diameter and current.

A significant attribute of the apparatus of the present invention is that it is capable of providing a highly focused beam at the target 28 under a first set of focusing conditions and of providing a high current beam at the target 28 under a second set of focusing conditions. The first set of focusing conditions are established such that the beam is focused at a cross-over point 72 lying approximately in the plane of the downstream electrode 62 of the first focusing lens 22. This results in the beam impinging on the diameter limiting electrode 24 out of focus. Under such conditions, only the centermost portion of the beam passes through the aperture 74. Since aberrations in the lens which limit the focusing of the beam more strongly influence the outer portion of the beam, the restricted passage ensures that the particles which do pass through may be focused by the second focusing lens to produce a small diameter beam at the target. Under the second set of focusing conditions, the beam is desirably focused at the plane of the aperture 74 so that substantially all of the beam passes therethrough to produce a high current beam at the target 28. While the total current is substantially reduced when operating under the first set of focusing conditions from that obtained under the second set of focusing conditions, the current density under both sets of conditions is approximately the same.

Typical operation of the apparatus of the present invention is conveniently described in a static mode of operation in conjunction with the production of a 2000 eV beam of neon ions. In such a use the apparatus is mounted in a conventional manner in a standard vacuum chamber fitted with appropriate electrical feedthroughs to enable the various electrodes to be appropriately energized. The chamber is evacuated by a vacuum pump to a pressure of less than about $10^{-8}$ Torr. If desired, a getter and liquid nitrogen cold surface may also be provided within the chamber to further purify the active elements remaining in the chamber. Neon is then released into the chamber by suitable valves until the static pressure is increased to approximately a pressure of $5 \times 10^{-5}$ Torr. At this point all openings to the chamber are closed and the neon atoms become uniformly dispersed within the chamber and within the ionization region formed within the cylinder grid 38.

Alternatively, the apparatus may also be operated in a dynamic mode by preferentially injecting a gas to be ionized into the region defined by grid 38. Such an operation is less demanding in terms of the overall composition of residual gas atoms, since the gases so injected will preferably be withdrawn downstream by conventional vacuum pumps.

A positive potential of 2000 eV is applied to the cylindrical grid 38 and to the supplemental extractor electrode 40 while a somewhat lower DC voltage of 1850 eV is applied to the filament 36 and to the outer cylinder 42. The filament 36 is then energized with 7 volts to provide an electron current of 15 milliamps. Electrons thus emitted are attracted toward the grid as a result of the difference in the potential between the filament and the grid and pass therethrough into the region within the grid. The resultant bombardment of the neon atoms within the grid produces a source of neon ions. The first electrode assembly 34 is energized with a potential of 1830 volts. This difference in potential causes the ions within the cylindrical grid 38 to be extracted through the apertures 44 and 18.

The second electrode assembly 52 is maintained at ground potential, and thus provides substantially a 2000 volt accelerating potential to attract ions passing through the aperture 18 downstream toward the second electrode assembly. The 2000 volt potential between the second electrode assembly and the ion source 14 and the fraction thereof (1830 volts) applied to the first electrode assembly together with the relative placement of these assemblies establish an electrostatic lens, a focal point of which is approximately at the aperture 18. This causes trajectories of the ions passing through the second electrode assembly to be substantially parallel.

Under a first set of focusing conditions, the first focusing lens 22 is preferably energized with the outer electrodes 58 and 62 grounded and with the center electrode 64 at a potential of 1800 volts. This causes the beam to be focused at the crossover point 72 which is approximately in the plane of the downstream electrode 62 of the first focusing lens 22. The diameter limiting electrode 24 is also at ground potential such that the beam upon leaving the first focusing lens 22 passes through an essentially field-free region. Under such conditions the beam will impinge on the diameter limiting electrode 24 substantially out of focus such that only the center portion of the beam passes through the aperture 74.

The second focusing lens 26 is energized with the outer electrodes 78 and 80 at ground potential and the center electrode 82 at a potential of 1585 volts, and thus causes the portion of the beam passing through the aperture 74 to be focused at the target 28, thereby providing a beam of approximately 100 micrometers in diameter and having a current of approximately 30 nanoamps. Under such conditions the target point 28 is approximately 2.5 cm from the downstream electrode 80. The ion beam thus produced is monoenergetic, having an energy spread of approximately ± 5 eV and has been found to be relatively independent of changes in the source gas pressure, the electron emission current, ionization voltage and extraction voltages.

Under the second set of focusing conditions, the potention on the center electrode 64 of the first focusing lens 22 is changed to 1333 volts, while the potential on the center electrode 82 of the second focusing lens 26 is changed to 1675 volts. Under such conditions the target 28 remains substantially at the same location, however, the cross-over point 72 of the beam emerging from the first focusing lens 22 is moved downstream to lie approximately in the plane of the diameter limiting electrode 24. Under these conditions substantially all of the beam passes through the aperture 74 and is then focused at the target 28. Under such conditions, a beam approximately 500 micrometers in diameter and approximately 700 nanoamps is produced.

In the above example, the current density of the beam at the target produced with the first set of focusing conditions is approximately 0.38 mA/cm$^2$, while that produced under the second set of focusing conditions is 0.35 mA/cm$^2$.

Such a beam of noble gas ions is desirably utilized in surface analysis techniques wherein it may be desirable to bombard the surface of a sample to be analyzed with a relatively intense beam of charged particles to thereby produce emissions from the surface indicative of characteristics of the surface so bombarded and to thereafter convert such emissions via conventional apparatus 33 into a spectrum indicative of such characteristics. It may be further desirable to bombard the surface with a small diameter beam produced as described hereinabove which is also deflected by appropriate deflection electrodes such as 29 and 30 so as to scan the surface of the sample. The emissions resulting from the bombardment of the small diameter scanned beam may then be converted via apparatus 33 into an emission indicative of spacial concentration variations of a characteristic shown in the previously prepared spectrum.

For example, an ion scattering spectrometer (ISS) such as disclosed in U.S. Pat. No. 3,665,182 may be modified to include the apparatus of the present invention. The apparatus may be first operated to provide a high current beam impinging on a surface portion. The high current results in a relatively high current of scattered ions, thereby allowing a spectrum showing the mass of elements on the surface of the sample to be rapidly generated. Upon determining the presence of a given atomic mass the beam may then be switched to another second set of focusing conditions to provide a small diameter beam. The energy analyzer associated with the ion scattering spectrometer may then be tuned to transmit only scattered ions indicative of a given atomic mass shown to be present in the spectrum. A signal corresponding to such scattered ions may then be generated. A display device such as a cathode ray tube may be deflected in synchronization with the scanning of the small diameter beam to form a raster corresponding to the scanned area. This raster may then be modulated by the electronic signal so produced to provide a graphic image of spacial variations of the selected atomic mass on the surface of the sample.

In another variation, the high current beam may similarly be deflected to also scan the surface of the sample positioned at the target thereby expanding the area of the analysis.

Another method of using the apparatus in a dual mode provides an improved depth profile analysis. In such a method, the high current beam is impinged upon the surface of a sample to be analyzed and causes surface atoms to be sputtered therefrom resulting in a crater on the surface. Charged particles indicative of surface characteristics may then be converted into a spectrum indicative of such characteristics. The focus may then be changed to provide a small beam which then bombards only the portion of the sample at the bottom of the crater. The charged particles indicative of the characteristic at the bottom portion may be converted into a spectrum indicative of the limited area at the bottom of the crater. In this manner, the variations and composition along the walls of the crater are prevented from obscuring analysis.

Alternatively, the small diameter beam may be deflected and a display means synchronized to the deflection as described hereinabove so as to display an image formed by a raster modulated by a signal corresponding to the concentration of a given characteristic. In this manner, changes in a given characteristic, such as a selected atomic mass, as a function of depth into the crater may be compared with the concentration of that characteristic on the surface of the sample.

The apparatus of the present invention may also be used to provide an electron beam to bombard the surface of the sample to be analyzed. In such a technique, the chamber, within which the apparatus is positioned, is evacuated. The potentials on the appropriate electrodes are reversed from that provided when the apparatus is used to provide an ion beam, to attract electrons produced from the filament 36 through the extractor apertures 44 and 18, thereby providing an electron beam impinging upon the target 28. This enables the analysis of surfaces according to conventional secondary electron microscopic techniques (SEM), Auger electron micrography, etc. Upon completion of such analysis, the potentials may then be reversed, gas atoms to be ionized may be introduced into the chamber, if not already present, and the same surface area analyzed according to conventional ion scattering spectroscopic (ISS) techniques or by secondary ion spectroscopic (SIMS) techniques without removing or modifying the sample being analyzed.

Having thus described the present invention, what is claimed is:

1. A charged particle beam apparatus comprising: (a) means for generating a charged particle beam including a source of charged particles and a primary extractor electrode having an aperture defining the effective diameter of said generated beam, (b) means for accelerating said charged particles in said beam, (c) a first focusing means for focusing said beam at a crossover point, (d) means for limiting the diameter of said focused beam, and (e) a second focusing means for focusing said beam at a target, each of said means being located along a beam axis downstream from previously recited means, THE IMPROVEMENT WHEREIN: said accelerating means comprises
   a first electrode assembly including said primary extractor electrode at the upstream end thereof and means for providing a circularly-symmetric axially-centered unipotential surface extending a first predetermined distance downstream from said extractor electrode,
   a second electrode assembly the upstream end of which is spaced a second predetermined distance downstream from the downstream end of said first electrode assembly and including means for providing a circularly-symmetric axially-centered unipotential surface extending axially a third predetermined distance,
   means for applying a given potential between said source of charged particles and said second electrode assembly, and
   means for applying a given fraction of said given potential to said first electrode assembly in order to establish an electrostatic lens, a focal point of which is approximately in the plane of the aperture of said primary extractor electrode such that the trajectories of charged particles passing through said second electrode assembly are substantially parallel, thereby enhancing the current density of the beam at said target under a given set of focusing conditions.

2. An apparatus according to claim 1, wherein said first, second and third predetermined distances are approximately equal.

3. An apparatus according to claim 1, wherein said unipotential surface of said first electrode assembly is cylindrical and wherein said first electrode assembly further includes a first acceleration electrode having a circular aperture at the downstream end thereof, which aperture is large relative to the aperture of the primary extractor electrode but is not greater in diameter than said first predetermined distance to lessen the effect of the fields emanating from said second electrode assembly on fields within said first electrode assembly.

4. An apparatus according to claim 3, wherein said unipotential surface of said second electrode assembly is cylindrical and wherein said second electrode assembly further includes a second acceleration electrode having a circular aperture at the upstream end thereof, which aperture is large relative to the aperture of the primary extractor electrode but which is not greater in diameter than said third predetermined distance to lessen the effect of fields emanating from said first electrode assembly on fields within said second electrode assembly.

5. An apparatus according to claim 4, wherein said primary extractor electrode, said first acceleration electrode and said second acceleration electrode are each planar and are parallel to each other.

6. An apparatus according to claim 1, wherein said charged particle generating means comprises
   a. a source of electrons,
   b. an electron permeable cylindrical grid which when electrically biased with respect to said source attracts electrons into the chamber within the grid,
   c. a supplemental extractor electrode positioned between said grid and said primary extractor electrode and parallel thereto and having a circular aperture axially centered such that when said primary extractor electrode is electrically biased with respect to said supplemental extractor electrode and said grid, the resultant electric field extends into said grid to enhance the extraction of charged particles therefrom.

7. An apparatus according to claim 6, wherein said source of electrons comprises a circular filament substantially encircling said cylindrical grid and lying in a plane approximately normal to said axis.

8. An apparatus according to claim 7, wherein said circular filament consists of a single turn.

9. An apparatus according to claim 7, wherein said circular filament is positioned upstream from the supplemental extractor electrode a distance not greater than the diameter of the aperture in said supplemental extractor electrode.

10. An apparatus according to claim 1, wherein the beam diameter defining aperture of the primary extractor electrode is 0.015 to 0.050 inch (0.038 to 0.127 cm).

11. An apparatus according to claim 1, wherein said first and second focusing means are first and second axially-located einzel lenses respectively.

12. An apparatus according to claim 11, wherein said first einzel lens comprises outer electrodes and an axially thick center electrode, all having axially-located apertures which are substantially equal in diameter and are not larger than said third predetermined distance and wherein the upstream outer electrode is integral with said second electrode assembly, is electrically coupled thereto and defines the downstream limit of the unipotential surface associated with the second electrode assembly.

13. An apparatus according to claim 12, wherein each of said outer electrodes of said first lens is spaced from said center electrode a distance approximately equal to the radius of the aperture therethrough, and wherein said center electrode of said first einzel lens has an axial length not less than the radius of the aperture therethrough, whereby the application of a potential to said first lens not greater than that potential applied between said source of charged particles and said second electrode assembly is sufficient to cause said cross-over point at which the beam is focused to lie in the plane of the downstream electrode of said first einzel lens.

14. An apparatus according to claim 11, wherein said means for limiting the diameter of said focused beam comprises a planar electrode positioned normal to said axis and having a circular aperture centered on said axis.

15. An apparatus according to claim 14, wherein said diameter limiting electrode is positioned from the upstream outer electrode of said second einzel lens a distance approximately equal to the diameter of the aperture through said upstream electrode.

16. An apparatus according to claim 15, wherein the radius of the aperture in said diameter limiting electrode is selected and said diameter limiting electrode is positioned downstream from the downstream electrode of said first einzel lens such that the ratio between said radius and the separation between said diameter limiting electrode and said downstream outer electrode of the first einzel lens is not greater than 0.1.

17. An apparatus according to claim 16, wherein said radius is selected and said diameter limiting electrode is positioned such that said ratio is maximized consistent with a desired minimum beam radius at the target according to the following expression:

$$\frac{r_A}{L} = \tan\left\{\frac{4r_t}{M_{L2}C_{S2}}\right\}^{1/3}, \text{ where}$$

$r_A$ is the radius of the aperture in said diameter limiting electrode,
L is the distance between said diameter limiting electrode and said downstream outer electrode of the first einzel lens,
$r_t$ is the beam radius at the target, ignoring components due to a finite source size,
$M_{L2}$ is the magnification factor of the second lens, and
$C_{s2}$ is the spherical aberration coefficient of the second lens.

18. An apparatus according to claim 17, wherein the diameter of said aperture in said diameter limiting electrode is substantially equal to the diameter of said diameter defining aperture of the primary extractor electrode.

19. An apparatus according to claim 17, wherein said aperture in said beam limiting electrode is 0.03 to 0.08 inch (0.075 to 0.20 cm).

20. An apparatus according to claim 1, wherein said second focusing means comprises an asymmetric einzel lens including relatively thin outer electrodes and an axially thick center electrode, all having axially located apertures therethrough, the diameters of the apertures in the upstream outer electrode and in the center electrode being approximately equal and the diameter of the aperture in the downstream outer electrode being somewhat smaller, whereby electrostatic fields within said second lens are shielded from external fields downstream of said second lens.

21. An apparatus according to claim 20, wherein the axial length of said center electrode of said einzel lens is not less than the radius of the aperture therethrough.

22. An apparatus according to claim 21, wherein the downstream outer electrode of said einzel lens is positioned to permit the beam to be focused by a potential less than the given potential between said source and said second electrode assembly on a target beyond said downstream outer electrode a distance sufficient to facilitate the intermediate placement of deflection plates.

23. An apparatus according to claim 22, wherein the center and upstream outer electrodes of said einzel lens are spaced by a distance greater than one-half but less than three times the diameter of the apertures therethrough to minimize spherical aberration.

24. A method of surface analysis using a dual mode charged particle beam apparatus comprising
positioning a sample, a surface of which is to be analyzed,
generating a beam of charged particles,
accelerating and directing said beam of charged particles into substantially parallel trajectories,
focusing said parallel beam at a first cross-over point,
refocusing substantially all of the particles emerging from the cross-over point in a high current beam which impinges on a portion of said surface,
converting emissions resulting from the high current beam into a spectrum indicative of characteristics of said surface portion,
changing the focus of said parallel beam to a second cross-over point substantially upstream from said first cross-over point,
blocking all but a small center portion of said beam,
focusing the said center portion of said beam into a small-diameter, spherical-aberration limited beam to produce emissions,
deflecting the small-diameter beam to scan said surface,
converting emissions resulting from the small-diameter beam into an electronic signal and in turn into an image indicative of spacial concentrations of a characteristic shown in said spectrum.

25. A method according to claim 24 further comprising deflecting the high current beam to scan the surface of a sample positioned at said target, thereby expanding the area of analysis.

26. A method of surface analysis using a dual mode charged particle beam apparatus comprising
positioning a sample, a surface of which is to be analyzed,
generating a beam of charged particles,
accelerating and directing said beam of charged particles into substantially parallel trajectories,
focusing said parallel beam at a first cross-over point,
refocusing substantially all of the particles emerging from the cross-over point in a high current beam which impinges on a portion of said surface, and which sputters atoms therefrom, resulting in a crater in said surface portion,
converting emissions resulting from the high current beam into a spectrum indicative of characteristics of the surface portion within said crater,
changing the focus of said parallel beam to a second cross-over point substantially upstream from said first cross-over point, blocking all but a small center portion of said beam,
focusing the said center portion into a small diameter spherical aberration limited beam to produce emissions, deflecting the small diameter beam to scan a portion of said surface including said crater, converting emissions resulting from the small diameter beam into an electronic signal and in turn into an image indicative of spacial concentrations of a characteristic shown in said spectrum, whereby changes in the concentration of said characteristic as a function of depth into said crater may be compared with the concentration of said characteristics on said surface within the scanned portion.

27. A method of surface analysis using a dual mode charged particle beam apparatus comprising positioning a sample, a surface of which is to be analyzed, generating a beam of electrons, accelerating and directing said beam of electrons into substantially parallel trajectories, focusing said parallel beam of electrons to impinge on a portion of said surface, converting a first type of emissions resulting from said electron impingement into an indication of certain characteristics of said impinged upon surface portion, supplying gas atoms into said apparatus, whereby electrons from said supply of electrons collide with and ionize said gas atoms, generating a beam of positive ions, accelerating and directing said beam of positive ions into substantially parallel trajectories, focusing said parallel beam of positive ions to impinge on the same portion of said surface, converting a second type of emissions resulting from said ion impingement into an indication of said another characteristic, whereby said another characteristic is determined without repositioning or altering said sample.

28. A method according to claim 27, wherein said step of converting said first type of emissions further comprises transmitting such electrons as are reflected, scattered or emitted from said surface portion, and converting the transmitted electrons into an electronic signal corresponding to characteristics indicative of the reflection, scattering or emission of said electrons.

29. A method according to claim 27, wherein said step of converting said second type of emissions further comprises transmitting a fraction of said gas ions scattered from said portion at a given angle, the loss of energy of which is indicative of the atomic weight of surface atoms off which said transmitted ions were scattered, receiving said scattered ions, and converting the same into an electronic signal and in turn into a spectrum of the atomic weight of atoms within said surface portion.

30. A method according to claim 27, further comprising deflecting either said beam of electrons or said beam of ions to scan an extended portion of said surface and synchronizing a display means with said deflection and modulating said display means with said electronic signal whereby particular characteristics within said extended portion of said surface are identified.

31. A method of surface analysis using the charged particle beam apparatus according to claim 1 comprising positioning a surface of a sample to be analyzed at said target, energizing said source of charged particles to provide a supply of electrons, applying a positive potential to said second electrode assembly with respect to said source, applying a given fraction of said positive potential to said first electrode assembly to cause a beam of electrons to be focused at and to impinge on a portion of said surface, converting a first type of emissions resulting from said electron impingement into an indication of certain characteristics of said impinged upon surface portion, supplying gas atoms into said apparatus, whereby electrons from said supply of electrons collide with an ionize said gas atoms, applying a negative potential to said second electrode assembly with respect to said source, applying a given fraction of said negative potential to said first electrode assembly to cause a beam of monoenergetic positive ions to be focused at and to impinge on the same portion of said surface, converting a second type of emissions resulting from said ion impingement into an indication of said another characteristic, whereby said another characteristic is determined without repositioning or altering said sample.

\* \* \* \* \*